United States Patent
Taniguchi et al.

(10) Patent No.: US 12,460,132 B2
(45) Date of Patent: Nov. 4, 2025

(54) METHOD FOR SUPPLYING COMPOSITION, COMPOSITION AND DRY ETCHING METHOD

(71) Applicant: CENTRAL GLASS COMPANY, LIMITED, Ube (JP)

(72) Inventors: Takahisa Taniguchi, Ube (JP); Hiroyuki Oomori, Ube (JP); Akifumi Yao, Ube (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 469 days.

(21) Appl. No.: 17/921,171

(22) PCT Filed: Apr. 27, 2021

(86) PCT No.: PCT/JP2021/016722
§ 371 (c)(1),
(2) Date: Oct. 25, 2022

(87) PCT Pub. No.: WO2021/221036
PCT Pub. Date: Nov. 4, 2021

(65) Prior Publication Data
US 2023/0167361 A1    Jun. 1, 2023

(30) Foreign Application Priority Data
Apr. 28, 2020   (JP) .................... 2020-079683

(51) Int. Cl.
*C09K 13/08*   (2006.01)
*H01L 21/311*   (2006.01)

(52) U.S. Cl.
CPC ........ *C09K 13/08* (2013.01); *H01L 21/31116* (2013.01)

(58) Field of Classification Search
None
See application file for complete search history.

(56) References Cited

U.S. PATENT DOCUMENTS

| 5,112,437 | A | 5/1992 | Watanabe et al. |
| 6,076,359 | A * | 6/2000 | Jurcik .............. F17C 7/04 219/521 |
| 6,581,412 | B2 * | 6/2003 | Pant ............... F17C 13/026 62/50.2 |
| 8,664,446 | B1 * | 3/2014 | Besancon .......... C07C 209/84 564/497 |
| 2010/0218964 | A1 * | 9/2010 | Galloway ............ B25C 1/04 173/218 |
| 2011/0166387 | A1 | 7/2011 | Ruppin et al. |
| 2019/0055469 | A1 | 2/2019 | Hyakutake |
| 2021/0375634 | A1 | 12/2021 | Suzuki et al. |
| 2023/0132629 | A1 * | 5/2023 | Sawamura ......... C09K 13/08 252/79.3 |
| 2023/0257339 | A1 * | 8/2023 | Shinmen ........... C07C 209/90 141/1 |

FOREIGN PATENT DOCUMENTS

| JP | 3-241832 | 10/1991 |
| JP | 2007-63159 | 3/2007 |
| JP | 2011-526611 | 10/2011 |
| WO | 2017/159544 | 9/2017 |
| WO | 2020/054476 | 3/2020 |

OTHER PUBLICATIONS

International Search Report issued Jul. 13, 2021 in International Application No. PCT/JP2021/016722.

* cited by examiner

*Primary Examiner* — Allan W. Olsen
(74) *Attorney, Agent, or Firm* — Wenderoth, Lind & Ponack, L.L.P.

(57) ABSTRACT

Provided is a method for stably supplying trimethylamine containing monomethylamine and/or dimethylamine as trace impurities at a constant makeup. The present invention relates to a method for supplying a composition including keeping a storage container that encloses a composition therein at a constant temperature of 10° C. or higher to supply a gas of the composition to a predetermined device. The composition contains, in a gaseous phase, trimethylamine, dimethylethylamine, and at least one of dimethylamine or monomethylamine.

10 Claims, No Drawings

METHOD FOR SUPPLYING COMPOSITION, COMPOSITION AND DRY ETCHING METHOD

TECHNICAL FIELD

The present disclosure relates to methods for supplying a composition containing trimethylamine and dimethylethylamine, compositions containing trimethylamine and dimethylethylamine, and dry etching methods.

BACKGROUND ART

In the field of semiconductors, stable microfabrication processes require supply of source gas at a constant makeup. Accordingly, source gas for semiconductor applications is commonly an ultra high purity product excluding impurities as much as possible.

Amines such as trimethylamine are examined as gas for rapid, highly selective etching of silicon oxide films. However, ultra high purification of amines requires large-scale equipment and enormous time, which causes a poor cost-benefit balance in many cases. In particular, trimethylamine is known to form a complicated azeotrope with dimethylamine and monomethylamine and to be difficult to isolate. Thus, a pure product of trimethylamine alone is difficult to prepare (e.g., Patent Literature 1).

In the case of using trimethylamine, the concentrations of dimethylamine and monomethylamine as impurities vary in response to the pressure during supply and the amount of trimethylamine used (amount of trimethylamine purged). Thus, trimethylamine is difficult to supply continuously at a constant makeup.

CITATION LIST

Patent Literature

Patent Literature 1: JP 2007-63159 A
Patent Literature 2: JP H03-241832 A

SUMMARY OF INVENTION

Technical Problem

Supply methods utilizing compositional azeotropy reported include a method of supplying hydrogen fluoride and ethanol in the form of mixture (e.g., Patent Literature 2). Still, no method of supplying amines utilizing compositional azeotropy has been known.

In response to the above issue, the present disclosure aims to provide a method for stably supplying trimethylamine containing monomethylamine and/or dimethylamine as trace impurities at a constant makeup.

Solution to Problem

As a result of extensive studies, the present inventors found that adding a small amount of dimethylethylamine to trimethylamine can form a stable azeotrope of trimethylamine with trace amounts of other methylamines such as monomethylamine and/or dimethylamine, which enables supply at a stable gas makeup regardless of the amount of trimethylamine used. Thus, the present invention was completed.

Specifically, the method for supplying a composition of the present disclosure includes: keeping a storage container that encloses a composition therein at a constant temperature of 10° C. or higher to supply a gas of the composition to a predetermined device, the composition containing in a gaseous phase, trimethylamine, dimethylethylamine, and at least one of dimethylamine or monomethylamine.

The method for supplying a composition of the present disclosure can supply the composition containing trimethylamine, dimethylethylamine, and at least one of dimethylamine or monomethylamine at a stable gas makeup regardless of the amount of trimethylamine used.

The composition of the present disclosure is intended to be used in the aforementioned method for supplying a composition, and contains trimethylamine, dimethylethylamine, and at least one of dimethylamine or monomethylamine in a gaseous phase.

Since the composition of the present disclosure contains dimethylethylamine, trimethylamine can be supplied at a stable gas makeup even when trimethylamine contains dimethylamine and/or monomethylamine as impurities. Further, dimethylethylamine has a structure similar to that of trimethylamine. Thus, advantageously, the presence of dimethylethylamine exerts less influence when the composition is used as an etching gas.

The dry etching method of the present disclosure includes reacting a gaseous composition supplied by the aforementioned method for supplying a composition and gaseous hydrogen fluoride with a silicon oxide without a plasma state.

Since the dry etching method of the present disclosure causes a gas of a composition having a stable makeup containing trimethylamine to react with a silicon oxide by the aforementioned method for supplying a composition, an etching treatment can be performed stably.

Advantageous Effects of Invention

In the method for supplying a composition of the present disclosure, adding a small amount of dimethylethylamine to trimethylamine can minimize a change in each of the amounts of dimethylamine and/or monomethylamine contained as impurities regardless of the amount of trimethylamine used when trimethylamine is supplied at a temperature under a certain condition, and therefore trimethylamine can be supplied at a stable gas makeup.

DESCRIPTION OF EMBODIMENTS

Hereinafter, the present disclosure is described in detail. The following descriptions of constituent elements are examples of embodiments of the present disclosure and the present disclosure is not limited to these specific descriptions. Various modifications may be made within the scope of the gist of the present disclosure.

The method for supplying a composition of the present disclosure includes: keeping a storage container that encloses a composition therein at a constant temperature of 10° C. or higher to supply a gas of the composition to a predetermined device, the composition containing, in a gaseous phase, trimethylamine, dimethylethylamine, and at least one of dimethylamine or monomethylamine.

The composition containing trimethylamine and other components in the storage container is mostly in a liquid phase based on its weight, while partly in a gaseous phase. In the method for supplying a composition of the present disclosure, the gaseous phase in the storage container, i.e., a gas of the composition is supplied to a predetermined device.

In the present disclosure, the composition to be enclosed in the storage container may be prepared by any method as long as it contains, in the gaseous phase, trimethylamine, dimethylethylamine, and at least one of dimethylamine or monomethylamine. Preferred is one prepared by adding dimethylethylamine to trimethylamine. Trimethylamine and dimethylethylamine each may be synthesized, or may be purchased, or may be prepared by any other way. The trimethylamine to be used in the present disclosure may be one containing at least one of dimethylamine or monomethylamine as impurities.

The amount of dimethylethylamine added is preferably 1 to 500 ppm by weight, more preferably 1 to 100 ppm by weight, with the whole amount of the composition taken as 100% by weight. A method of adding dimethylethylamine to trimethylamine used may be any method known to those skilled in the art, such as a manometric blending method, a gravimetric method, a semi-gravimetric method, or a flow blending method.

Trimethylamine and dimethylethylamine charged into the storage container are preferably further mixed with each other. This mixing may be performed by shake mixing or inversion mixing, for example.

In the present disclosure, the composition contains, in the gaseous phase, trimethylamine and dimethylethylamine, as well as at least one of dimethylamine or monomethylamine. In other words, the composition contains, in the gaseous phase, trimethylamine, dimethylethylamine, and dimethylamine, or contains, in the gaseous phase, trimethylamine, dimethylethylamine, and monomethylamine, or contains trimethylamine, dimethylethylamine, dimethylamine, and monomethylamine.

The composition contains, in the gaseous phase, trimethylamine in an amount of preferably 95% by volume or more, more preferably 98% by volume or more, still more preferably 99% by volume or more.

The composition contains, in the gaseous phase, dimethylethylamine in an amount of preferably 1 to 100 ppm by volume, more preferably 1 to 50 ppm by volume.

The composition may contain, in the gaseous phase, dimethylamine in an amount of preferably 0 to 1000 ppm by volume, more preferably 0 to 400 ppm by volume.

The composition may contain, in the gaseous phase, monomethylamine in an amount of preferably 0 to 100 ppm by volume, more preferably 0 to 50 ppm by volume.

In a preferred embodiment of the present disclosure, the composition contains, in the gaseous phase, trimethylamine in an amount of 95% by volume or more, dimethylethylamine in an amount of 1 to 100 ppm by volume, dimethylamine in an amount of 0 to 1000 ppm by volume, and monomethylamine in an amount of 0 to 100 ppm by volume.

In a more preferred embodiment of the present disclosure, the composition contains, in the gaseous phase, trimethylamine in an amount of 95% by volume or more, dimethylethylamine in an amount of 1 to 50 ppm by volume, dimethylamine in an amount of 0 to 400 ppm by volume, and monomethylamine in an amount of 0 to 50 ppm by volume.

The composition may contain, in the gaseous phase, different impurities other than monomethylamine and dimethylamine. Examples of different impurities include moisture, inert gas, ammonia, carbon monoxide, carbon dioxide, methane, and methanol. Moisture may be contained in an amount of 1 to 1000 ppm by volume in the gaseous phase of the composition. The amount of inert gas contained is preferably 5% by volume or less, more preferably 1% by volume or less in the gaseous phase of the composition.

In the method for supplying a composition of the present disclosure, the storage container that encloses the composition is kept at a constant temperature of 10° C. or higher. A temperature lower than 10° C. causes an unstable gas makeup of the gaseous phase in the storage container, which results in significant changes in the concentrations of monomethylamine, dimethylamine, and dimethylethylamine before and after supplying a certain amount of the gas of the composition. The temperature at which the storage container is stored is preferably 10° C. to 50° C., more preferably 15° C. to 40° C.

The storage container to enclose the composition may be any container that can store, for example, liquid trimethylamine. The storage container to be used may be a container formed from stainless steel (SUS), manganese steel, nickel steel, chromium molybdenum steel, or the like.

The storage container may be kept at a constant temperature by any method, and any method known to those skilled in the art may be used.

In the present disclosure, the storage container that encloses the composition is kept at a constant temperature of 10° C. or higher, and then a gas of the composition is supplied to a predetermined device.

The gas of the composition may be supplied at any rate, preferably 1 to 5000 ml/min, more preferably 5 to 1000 ml/min.

The gas of the composition may be supplied to a predetermined device by, for example, a method in which a supply section is provided that connects the storage container enclosing the composition and the predetermined device and the gas of the composition is directly introduced from the storage container to the predetermined device.

The predetermined device may be, but is not limited to, an etching device for etching a silicon oxide film.

In the present disclosure, preferably, the amounts of trimethylamine, dimethylethylamine, dimethylamine, and monomethylamine contained in the gaseous phase after supplying the gas of the composition such that 90% by weight of the whole amount of the composition is supplied each show a variation of 10% or smaller in comparison with the respective amounts before start of the supply. In other words, the method for supplying a composition of the present disclosure can achieve a difference of 10% or smaller between the amounts of trimethylamine, dimethylethylamine, dimethylamine, and monomethylamine in the gaseous phase before start of supply and the respective amounts of trimethylamine, dimethyl ethylamine, dimethylamine, and monomethylamine in the gaseous phase after supplying 90% by weight of the whole amount of the composition.

The present disclosure also relates to a composition containing trimethylamine, dimethylethylamine, and at least one of dimethylamine or monomethylamine in a gaseous phase for use in the aforementioned method for supplying a composition.

The present disclosure also relates to a dry etching method including reacting a gaseous composition supplied by the aforementioned method for supplying a composition and gaseous hydrogen fluoride with a silicon oxide without a plasma state. The gaseous composition supplied by the aforementioned method for supplying a composition refers to a gas of the composition, which mainly contains trimethylamine and further contains dimethylethylamine and at least one of dimethylamine or monomethylamine.

In the etching method of the present disclosure, gaseous trimethylamine and gaseous hydrogen fluoride are caused to react with a silicon oxide without a plasma state. Thus, the silicon oxide is dry-etched without generating plasma gas.

The dry etching method of the present disclosure can be classified into two embodiments, i.e., a first embodiment in which gaseous hydrogen fluoride and a gas of a composition containing trimethylamine are supplied to an etching device and brought into contact with a silicon oxide, whereby the silicon oxide is dry-etched, and a second embodiment in which a gas of a composition containing trimethylamine and gaseous hydrogen fluoride are separately supplied to an etching device, whereby the silicon oxide is dry-etched. In either embodiment, the reaction compound to be finally generated is a trimethylamine salt of hexafluorosilicic acid, and this compound is sublimed into gas or thermolyzed into gas as soon as it is generated.

In the first embodiment, the gaseous hydrogen fluoride and the gas of the composition containing trimethylamine may be partially or completely converted into a hydrogen fluoride salt of the composition containing trimethylamine.

The gaseous hydrogen fluoride and the gas of the composition containing trimethylamine are brought into contact with a silicon oxide at a temperature of preferably 200° C. or lower, more preferably 150° C. or lower, particularly preferably 120° C. or lower. The contact temperature is also preferably 20° C. or higher, more preferably 50° C. or higher, particularly preferably 80° C. or higher.

The mixing ratio of the hydrogen fluoride and the gas of the composition containing trimethylamine in terms of the value obtained by dividing the total number of moles of the composition containing trimethylamine by the number of moles of the hydrogen fluoride, is preferably 0.001 or higher and 100 or lower, more preferably 0.01 or higher and 10 or lower, particularly preferably 0.1 or higher and 5 or lower.

The dry etching method of the present disclosure is applicable to etching of a semiconductor substrate including a silicon oxide film. For example, in the case where a substrate to be treated includes a silicon oxide film and a silicon nitride film both exposed at a surface, the silicon oxide film alone can be selectively etched.

EXAMPLES

Hereinbelow, examples are described which more specifically disclose embodiments of the present disclosure. The present disclosure is not limited to these examples.

Example 1

A SUS container was charged with 1 kg of trimethylamine (TMA) having a purity of 99.9% by volume or more, and 15 mg of dimethylethylamine (DMEA) was added thereto. While the container was kept at room temperature, the components were sufficiently mixed and gas was discharged from the container. The gaseous phase was subjected to composition analysis and was found to contain DMEA at a concentration of 12 ppm by volume, dimethylamine (DMA) at a concentration of 387 ppm by volume, and moisture at a concentration of 410 ppm by volume. The concentration of monomethylamine (MMA) was less than 1 ppm by volume. The composition analysis of the gaseous phase was performed using a gas chromatograph (GC-2014, available from Shimadzu Corp., detector: FID). The container was cooled to 15° C. and purging was performed at a flow rate of 1000 ml/min. After the amount of TMA remaining in the container was found to reach 0.1 kg (90% by weight of TMA was used), the gaseous phase was again subjected to composition analysis. The composition analysis of the gaseous phase at this time was performed at room temperature on the gas purged from the container cooled to 15° C. As a result, the concentration of TMA was 99.9% by volume or more, the concentration of DMA was 380 ppm by volume, the concentration of MMA was less than 1 ppm by volume, and the concentration of DMEA was 13 ppm by volume. The results are shown in Table 1.

Example 2

A SUS container was charged with 1 kg of trimethylamine (TMA) different from that in Example 1 and having a purity of 99.9% by volume or more, and 15 mg of dimethylethylamine (DMEA) was added thereto. The components were sufficiently mixed and gas was discharged from the container, followed by composition analysis of the gaseous phase. As a result, the gaseous phase was found to have a makeup including a DMA concentration of 12 ppm by volume, a MMA concentration of less than 1 ppm by volume, a DMEA concentration of 11 ppm by volume, and a moisture concentration of 10 ppm by volume. Purging was performed under the conditions as in Example 1, followed by composition analysis. The results are shown in Table 1.

Example 3

A SUS container was charged with 1 kg of trimethylamine (TMA) different from those in Examples 1 and 2 and having a purity of 99.9% by volume or more, and 15 mg of dimethylethylamine (DMEA) was added thereto. The components were sufficiently mixed and gas was discharged from the container, followed by composition analysis of the gaseous phase. As a result, the gaseous phase was found to have a makeup including a DMA concentration of 13 ppm by volume, a MMA concentration of 45 ppm by volume, a DMEA concentration of 5 ppm by volume, and a moisture concentration of 1 ppm by volume. Purging was performed under the conditions as in Example 1 except that the temperature of the container was 40° C., followed by composition analysis. The results are shown in Table 1.

Comparative Example 1

Except that DMEA was not added, the same trimethylamine (TMA) as in Example 1 was used and purging was performed under the conditions as in Example 1, followed by composition analysis. The results are shown in Table 1.

Comparative Example 2

Except that DMEA was not added, the same trimethylamine (TMA) as in Example 3 was used and purging was performed under the conditions as in Example 1, followed by composition analysis. The results are shown in Table 1.

Comparative Example 3

The same trimethylamine (TMA) as in Example 1 was used and 15 mg of dimethylethylamine (DMEA) was added as in Example 1. The makeup was analyzed to give the values shown in Table 1. The temperature of the container was then cooled to 5° C. and purging was performed under the conditions as in Example 1, followed by composition analysis. The results are shown in Table 1.

TABLE 1

| | Purging temperature | Gas makeup before use (vol %, vol ppm) | | | | Gas makeup after 90 wt % use (vol %, vol ppm) | | | | Relative amount of change Δ [{(gas makeup after 90 wt % use)-(gas makeup before use)}/ gas composition before use] | | | |
|---|---|---|---|---|---|---|---|---|---|---|---|---|---|
| | | TMA | DMA | MMA | DMEA | TMA | DMA | MMA | DMEA | TMA | DMA | MMA | DMEA |
| Example 1 | 15° C. | >99.9% | 387 ppm | <1 ppm | 12 ppm | >99.9% | 380 ppm | <1 ppm | 13 ppm | — | −1.80% | 0.00% | 8.30% |
| Example 2 | 15° C. | >99.9% | 12 ppm | <1 ppm | 11 ppm | >99.9% | 11 ppm | <1 ppm | 12 ppm | — | −8.30% | 0.00% | 9.10% |
| Example 3 | 40° C. | >99.9% | 13 ppm | 45 ppm | 5 ppm | >99.9% | 13 ppm | 43 ppm | 5 ppm | — | 0.00% | −4.40% | 0.00% |
| Comparative Example 1 | 15° C. | >99.9% | 395 ppm | <1 ppm | — | >99.9% | 100 ppm | <1 ppm | — | — | −74.70% | 0.00% | — |
| Comparative Example 2 | 40° C. | >99.9% | 11 ppm | 48 ppm | — | >99.9% | 2 ppm | 10 ppm | — | — | −81.80% | −79.20% | — |
| Comparative Example 3 | 5° C. | >99.9% | 352 ppm | <1 ppm | 15 ppm | >99.9% | 124 ppm | <1 ppm | 32 ppm | — | −64.80% | 0.00% | 113.30% |

In Examples 1 and 2 where DMEA was added and the purging temperature was 15° C. as well as Example 3 where the purging temperature was 40° C., TMA, DMA, MMA, and DMEA each showed a variation of zero to several percent in terms of the relative amount of change Δ [{(gas makeup after 90% by weight use)-(gas makeup before use)}/gas makeup before use] even after 90% by weight of the gaseous composition was purged in comparison with the gas makeup before purging. In contrast, in Comparative Examples 1 and 2 where no DMEA was added, the concentration of DMA was reduced by about 75% in terms of the relative amount of change Δ in Comparative Example 1, while DMA was reduced by about 82% in terms of the relative amount of change Δ and MMA was reduced by about 79% in terms of the relative amount of change Δ in Comparative Example 2. In Comparative Example 3 where DMEA was added and the purging temperature was 5° C., the concentration of DMA was reduced by about 65% in terms of the relative amount of change Δ and the concentration of DMEA was increased by about 113% in terms of the relative amount of change Δ.

The invention claimed is:

1. A method for supplying a composition comprising:
keeping a storage container that encloses a composition therein at a constant temperature of 10° C. or higher to supply a gas of the composition to a predetermined device,
wherein the composition contains, in a gaseous phase, trimethylamine, dimethylethylamine, and at least one of dimethylamine or monomethylamine, and
wherein the composition contains, in the gaseous phase, the trimethylamine in an amount of 95% by volume or more.

2. The method for supplying a composition according to claim 1,
wherein the composition contains, in the gaseous phase, the dimethylethylamine in an amount of 1 to 100 ppm by volume, the dimethylamine in an amount of 0 to 1000 ppm by volume, and the monomethylamine in an amount of 0 to 100 ppm by volume.

3. The method for supplying a composition according to claim 1,
wherein the composition contains, in the gaseous phase, the dimethylethylamine in an amount of 1 to 50 ppm by volume, the dimethylamine in an amount of 0 to 400 ppm by volume, and the monomethylamine in an amount of 0 to 50 ppm by volume.

4. The method for supplying a composition according to claim 1,
wherein the storage container is kept at a constant temperature of 10° C. to 50° C.

5. The method for supplying a composition according to claim 1,
wherein the storage container is kept at a constant temperature of 15° C. to 40° C.

6. The method for supplying a composition according to claim 1,
wherein amounts of the trimethylamine, the dimethylethylamine, the dimethylamine, and the monomethylamine contained in the gaseous phase after supplying the gas of the composition such that 90% by weight of the whole amount of the composition is supplied each show a variation of 10% or smaller in comparison with the respective amounts before start of the supply.

7. The method for supplying a composition according to claim 1,
wherein the gaseous phase further contains 1 to 1000 ppm by volume of moisture.

8. The method for supplying a composition according to claim 1,
wherein the gaseous phase further contains inert gas.

9. A composition comprising trimethylamine, dimethylethylamine, and at least one of dimethylamine or monomethylamine in a gaseous phase for use in the method for supplying a composition according to claim 1,
wherein the composition contains, in the gaseous phase, the trimethylamine in an amount of 95% by volume or more.

10. A dry etching method comprising:
reacting a gaseous composition supplied by the method for supplying a composition according to claim 1 and gaseous hydrogen fluoride with silicon oxide without a plasma state.

* * * * *